United States Patent
Nath et al.

(10) Patent No.: US 9,583,813 B2
(45) Date of Patent: Feb. 28, 2017

(54) SYSTEMS AND METHODS FOR MANUFACTURING PASSIVE WAVEGUIDE COMPONENTS

(71) Applicant: Aviat U.S., Inc., Santa Clara, CA (US)

(72) Inventors: Jayesh Nath, Milpitas, CA (US); Ying Shen, Chapel Hill, NC (US); Edwin Nealis, Cary, NC (US)

(73) Assignee: Aviat U.S., Inc., Milpitas, CA (US)

( * ) Notice: Subject to any disclaimer, the term of this patent is extended or adjusted under 35 U.S.C. 154(b) by 97 days.

(21) Appl. No.: 14/453,563

(22) Filed: Aug. 6, 2014

(65) Prior Publication Data

US 2014/0347144 A1    Nov. 27, 2014

Related U.S. Application Data

(62) Division of application No. 13/249,189, filed on Sep. 29, 2011, now Pat. No. 9,190,706.

(Continued)

(51) Int. Cl.
*H01P 11/00* (2006.01)
*H03H 3/007* (2006.01)
*H01P 1/207* (2006.01)
*G02B 6/125* (2006.01)
*G02B 6/138* (2006.01)
*H03H 3/00* (2006.01)

(Continued)

(52) U.S. Cl.
CPC ............ *H01P 11/003* (2013.01); *G02B 6/125* (2013.01); *G02B 6/138* (2013.01); *H01P 1/207* (2013.01);

(Continued)

(58) Field of Classification Search
CPC ...... H01P 11/003; H01P 11/002; H01P 1/207; H03H 3/007; G02B 6/138; G02B 6/125;

(Continued)

(56) References Cited

U.S. PATENT DOCUMENTS 5,382,931 A * 1/1995 Piloto ..................... H01P 1/207
                                                      333/208
5,892,419 A * 4/1999 Kotanen ................. H01P 1/202
                                                       29/600

(Continued)

OTHER PUBLICATIONS

European Patent Application No. 11831350.1, Search Report mailed Jul. 13, 2015.

(Continued)

*Primary Examiner* — Peter DungBa Vo
*Assistant Examiner* — Jeffrey T Carley
(74) *Attorney, Agent, or Firm* — Sheppard, Mullin, Richter & Hampton LLP

(57) ABSTRACT

Various embodiments are directed toward systems and method for manufacturing low cost passive waveguide components. For example, various embodiments relate to low cost manufacturing of passive waveguide components, including without limitation, waveguide filters, waveguide diplexers, waveguide multiplexers, waveguide bends, waveguide transitions, waveguide spacers, and antenna adapters. Some embodiments comprise manufacturing a passive waveguide component by creating a non-conductive structure using a low cost fabrication technology, such as injection molding or three-dimensional (3D) printing, and then forming a conductive layer over the non-conductive structure such that the conductive layer creates an electrical feature of the passive waveguide component.

10 Claims, 9 Drawing Sheets

Related U.S. Application Data

(60) Provisional application No. 61/387,951, filed on Sep. 29, 2010.

(51) Int. Cl.
*H03H 7/46* (2006.01)

(52) U.S. Cl.
CPC .......... *H01P 11/001* (2013.01); *H01P 11/002* (2013.01); *H03H 3/00* (2013.01); *H03H 3/007* (2013.01); *H03H 7/468* (2013.01); *Y10T 29/49002* (2015.01); *Y10T 29/49016* (2015.01); *Y10T 29/49117* (2015.01)

(58) Field of Classification Search
CPC .......... Y10T 29/49002; Y10T 29/49016; Y10T 29/49117
See application file for complete search history.

(56) References Cited

U.S. PATENT DOCUMENTS

| | | |
|---|---|---|
| 6,201,508 B1 | 3/2001 | Metzen et al. |
| 7,256,667 B1 | 8/2007 | Forman |
| 7,795,995 B2 | 9/2010 | White et al. |
| 2003/0222738 A1 | 12/2003 | Brown et al. |
| 2010/0102899 A1 | 4/2010 | Engel |

OTHER PUBLICATIONS

European Patent Application No. 11831350.1, Partial Search Report mailed Mar. 26, 2015.

International Application No. PCT/US2011/054086, International Search Report and Written Opinion mailed Jan. 20, 2012.

\* cited by examiner

SYSTEMS AND METHODS FOR MANUFACTURING PASSIVE WAVEGUIDE COMPONENTS

CROSS-REFERENCE TO RELATED APPLICATIONS

This application is a divisional of U.S. patent application Ser. No. 13/249,189, filed Sep. 29, 2011 and entitled "Systems and Methods for Manufacturing Passive Waveguide Components," which claims priority to U.S. Provisional Patent Application Ser. No. 61/387,951 filed Sep. 29, 2010 and entitled "Methods and Apparatus for Fabrication of Low Cost Passive Microwave Components," which are hereby incorporated by reference.

FIELD OF THE INVENTION(S)

The present invention(s) relate to waveguide components, and more particularly, some embodiments relate to manufacturing passive waveguide components at reduced cost.

DESCRIPTION OF THE RELATED ART

Waveguide components are an integral component in many microwave communication systems. Generally, waveguide components consist of hollow metal pipes that are purposefully shaped and specifically dimensioned to guide and/or propagate an electromagnetic wave of a particular frequency from one end of the waveguide component to other. Traditionally, these waveguides components are manufactured using a Computer Numerically Controlled (CNC) machine process or a die-cast process, depending on the volume of waveguide components that need to be manufactured.

Unfortunately, traditional manufacturing processes for waveguide components suffer from several drawbacks. One such drawback is that CNC machine and die-cast processing tend to be expensive and require an operator with considerable skill (e.g., a trained machinist). Another drawback is that the metals typically used in traditional waveguide components are susceptible to large market price fluctuations due to global supply and demand. Another drawback is that with conventional waveguide manufacturing, waveguide components are unable to be produced on an "on-demand" basis, and requires a lead-time.

Many of these drawbacks contribute to the high cost that is typical of conventional waveguide components. The cost of waveguide components is of particular concern in the microwave communication industry, given the fact that the cost of passive waveguide components, such as diplexers, antennas, and spacers, may constitute as much as 15 to 25% of the total cost of a microwave communication system. Nevertheless, in recent years there has been little to no advancement made in manufacturing passive waveguide components at a reduced cost.

SUMMARY OF EMBODIMENTS

Various embodiments provide for systems and method for manufacturing low cost passive waveguide components, such as passive waveguide components.

According to some embodiments, a method for manufacturing a passive waveguide component is provided. The method may comprise receiving a design for the passive waveguide component, receiving a non-conductive material, fabricating a non-conductive structure of the passive waveguide component based on the design, wherein the non-conductive structure comprises the non-conductive material, and forming a conductive layer on an exposed surface of at least one non-conductive structural feature of the non-conductive structure to create an electrical feature of the passive waveguide components.

Depending on the embodiment, fabricating the non-conductive structure based on the design may comprise fabricating the non-conductive structure using three-dimensional (3D) printing or plastic injection molding, and the non-conductive material may comprise plastic, ceramic, or wood. For example, the conductive layer may comprise copper or silver. Additionally, depending on the embodiment, forming the conductive layer on the exposed surface of the at least one non-conductive structural feature of the non-conductive structure may comprise plating the exposed surface with a conductive material. For some embodiments, the passive waveguide component may be a waveguide filter, waveguide diplexer, waveguide multiplexer, a waveguide bend, a waveguide transition, a waveguide spacer, or an antenna adapter.

In some embodiments, the method may further comprise trimming or polishing the non-conductive structure or the conductive layer. For some embodiments, the conductive layer may have a thickness that enables or creates the electrical feature of the passive waveguide component to function within an accepted parameter. For example, the conductive layer may have a thickness that enables the conductive layer to benefit from skin effect and permit the bulk of a current operating at radio or microwave frequencies to flow through the conductive layer. To that end, in some embodiments, the conductive layer may have a thickness that is greater than or equal to a skin depth for the conductive layer, where the skin depth is determined based on the conductive material of the conductive layer and the frequency of the current to be carried by the layer (e.g., radio or microwave frequency). For some embodiments, this results in the conductive layer having a thickness of only a few microns (e.g., few microns of copper or silver plating).

In various embodiments, the method may further comprise identifying, in the design, a first structural feature of the passive waveguide component that is not implementable as a non-conductive structural feature of the non-conductive structure. The method may further comprise modifying, in the design, the first structural feature to a second structural feature. The second structural feature may be implementable as a non-conductive structural feature of the non-conductive structure.

In some embodiments, the method may further comprise identifying, in the design, a plane through the passive waveguide component along which the passive waveguide component may be split into a plurality of separate structural features. The plurality of separate structural features may be adapted for fabrication as a plurality of separate non-conductive structural features of the non-conductive structure. The plurality of separate structural features may also be adapted for receiving the conductive layer. The method may further comprise splitting, in the design, the passive waveguide component along the plane, thereby resulting in the plurality of separate structural features. For example, the method may identify an E-plane or an H-plane of the passive waveguide component and split the passive waveguide component along the E-plane or H-plane, thereby resulting in the plurality of separate structural features.

In some embodiments where the plurality of structural features results, fabricating the non-conductive structure based on the design may comprise fabricating the plurality of separate structural features of the passive waveguide component as the plurality of separate non-conductive structural features of the non-conductive structure. Additionally, in some embodiments where the plurality of separate non-conductive structural features results, the method may further comprise assembling the plurality of separate non-conductive structural features of the non-conductive. Depending on the embodiment, the assembling of the plurality of separate non-conductive structural features may occur before or after the conductive layer is formed over on an exposed surface of the at least one non-conductive structural feature of the non-conductive structure.

According to some embodiments, a waveguide or passive waveguide diplexer is provided, where the waveguide or passive waveguide diplexer is manufactured by various steps described herein. Further, according to some embodiments, various steps described herein may be implemented using a digital device. For instance, some embodiments provide for a computer program product comprising a computer useable medium having computer program code embodied therein for causing a computing device (i.e., a digital device) to perform design and design modification steps according to some embodiments.

Other features and aspects of various embodiments will become apparent from the following detailed description, taken in conjunction with the accompanying drawings, which illustrate, by way of example, the features of the various embodiments.

BRIEF DESCRIPTION OF THE DRAWINGS

Various embodiments are described in detail with reference to the following figures. The drawings are provided for purposes of illustration only and merely depict some example embodiments. These drawings are provided to facilitate the reader's understanding of the various embodiments and shall not be considered limiting of the breadth, scope, or applicability of embodiments.

The figures are not intended to be exhaustive or to limit some embodiments to the precise form disclosed. It should be understood that various embodiments may be practiced with modification and alteration, and that various embodiments be limited only by the claims and the equivalents thereof.

DETAILED DESCRIPTION OF VARIOUS EMBODIMENTS

Various embodiments are directed toward systems and method for manufacturing passive waveguide components. According to some embodiments, systems and methods may provide manufacturing of passive waveguide components such as, but not limited to, waveguide filters, waveguide diplexers (e.g., no-tune waveguide diplexer used in the 60 GHz spectrum), waveguide multiplexers, waveguide bends, waveguide transitions, waveguide spacers, and an antenna adapter. The systems and methods may also provide lightweight passive waveguide components, and facilitate manufacturing of passive waveguide components "on demand" (i.e., quick manufacturing of passive waveguide components with little to no lead-time). Some embodiments may facilitate manufacturing of passive waveguide components having complex geometries, without the need of substantial computer-aided design (CAD) file manipulation.

Some embodiments comprise manufacturing a passive waveguide component by creating a non-conductive structure using a low cost fabrication technology, and then forming a conductive layer over the non-conductive structure to create an electrical feature of the passive waveguide component. For example, in order to create the electrical feature, the conductive layer formed may have a thickness that is greater than or equal to a skin depth for the conductive layer. The skin depth may be determined based on the conductive material of the conductive layer and the frequency of the current to be carried by the conductive layer (e.g., radio or microwave frequency). With a thickness that is greater than or equal to a skin depth, the conductive layer may utilize skin effect and permit the bulk of a current operating at radio or microwave frequencies to flow through the conductive layer.

Figure 1:
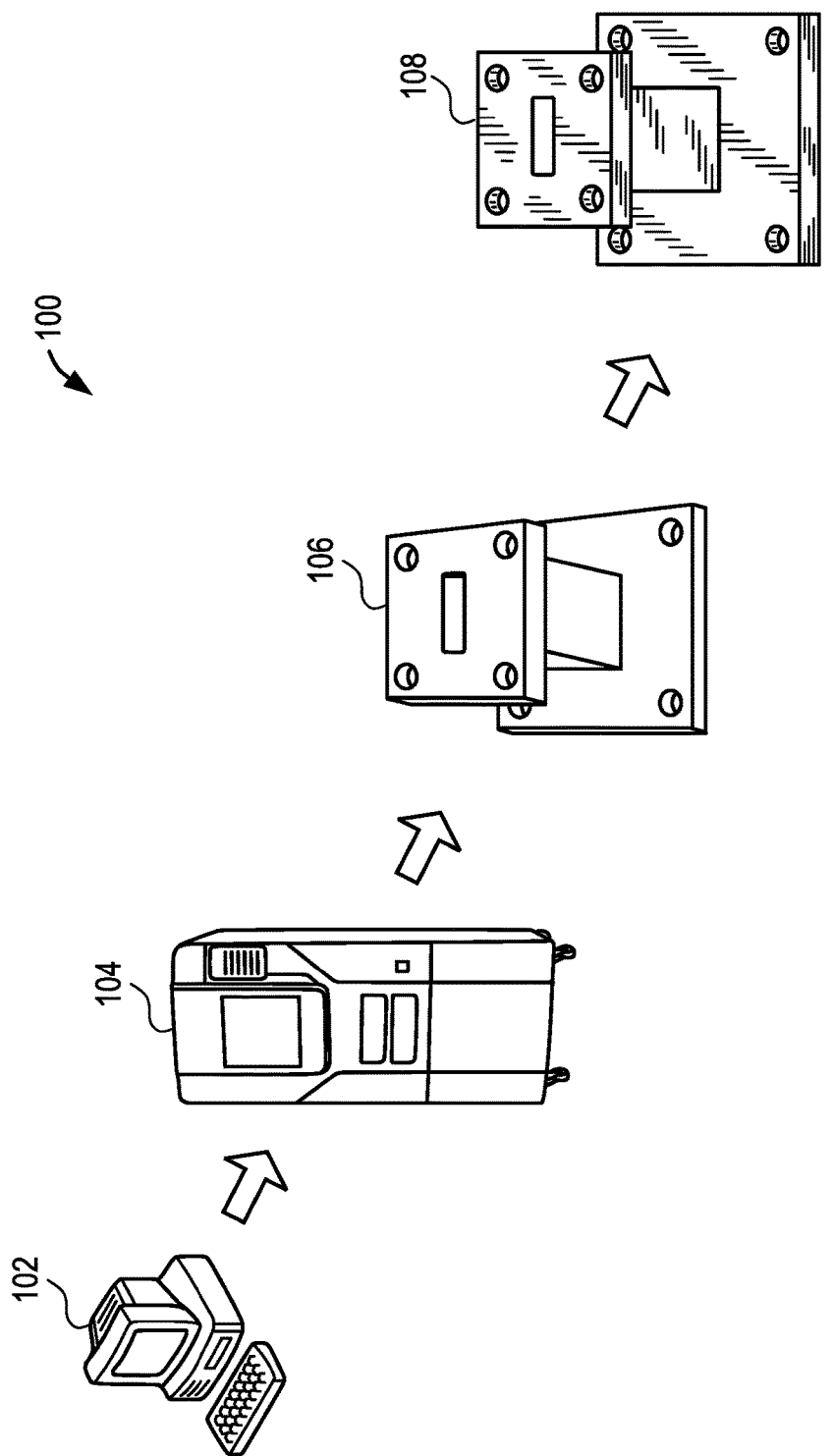
FIG. 1 is a flowchart illustrating an example manufacturing flow for a passive waveguide component according to some embodiments.

FIG. 1 is a flowchart illustrating an example manufacturing flow 100 for a passive waveguide component according to some embodiments. When the manufacturing flow 100 begins, the computing system 102 receives or creates a design of a passive waveguide component. A computer system 102 may be a digital device. A digital device is any device with a processor and memory. The digital device is further described with regard to FIG. 12. In some examples, the computing system 102 may receive or create a design comprising a passive waveguide (e.g., a diplexer or a waveguide spacer).

In some embodiments, the design received or created by the computer system 102 may be embodied in a design file, such as a computer-aided design (CAD) file, which can be stored on a memory device (e.g., a computer readable medium such as a hard drive, thumb drive, flash media, optical disc or the like) coupled to the computer system 102. In general, the design file may be in a format that is compatible with a low cost fabrication technology utilized in some embodiments, such as injection molding or three-dimensional (3D) printing.

The design received or created by the computer system 102 may also be modified using the computer system 102. The design may be modified for any number of different reasons including, for example, to enable or improve the fabrication of a non-conductive structure by a particular fabrication technology (e.g., injection molding or three-dimensional printing). In another example, the design may be modified such that once a non-conductive structure is fabricated from the modified design. The resulting non-conductive structure may be prepared to receive a conductive layer.

The fabrication system 104 may be configured to receive the design of the passive waveguide component from the computer system 102, and fabricate a non-conductive structure 106 from the design. In some embodiments, the computer system 102 provides commands and/or instructions to the fabrication system 104 based on the design to fabricate the passive waveguide component. In some embodiments, the fabrication system 104 may employ injection molding or three-dimensional (3D) printing in order to create the non-conductive structure. Additionally, depending on the embodiment, and the fabrication technology utilized, the fabrication system 104 may comprise of one or more functional modules that facilitate the fabrication of the design.

In some embodiments, the fabrication system 104 may comprise a three-dimensional (3D) printer configured to create a plastic model using powder and binder, or using acrylonitrile butadiene styrene (ABS) plastic deposition. For some embodiments, the three-dimensional (3D) printer may comprise a ZPrinter® from Z Corporation (which is a powder based printer), or a Dimension 3D Printer from Stratasys, Inc. (which is a fused deposition printer using ABS plastic). The fabrication system 104 depicted in FIG. 1 is a Dimension 3D Printer.

In another example, the fabrication system 104 may comprise a first module that creates a mold of the non-conductive structure, and a second module that creates instances of the non-conductive structure using the mold. In some embodiments, the first module may comprise a three-dimension printer, like described herein, configured to create a mold for the second module, and the second module may comprise an injection molding machine.

As described herein, the fabrication system 104 may fabricate the non-conductive structure 106 from a design of the waveguide component. In FIG. 1, the fabrication system 104 has fabricated a non-conductive structure 106 from a design of a waveguide spacer.

A conductive layer may be formed at least partially on an exposed surface of the non-conductive structure 106, thereby resulting in conductive structure 108. A conductive structure 108 is any structure that is at least partially conductive. In some examples, the conductive layer may be formed on the exposed surface using electroplating or electroless plating. For example, the conductive layer of conductive structure 108 may comprise a copper plating or a silver plating.

In some embodiments, once the passive waveguide component is constructed through the manufacturing flow 100, the passive waveguide component may be tested for electrical performance and/or functionality. For example, where the passive waveguide component is a waveguide spacer, the passive waveguide component may be tested for electrical sensitivity and for frequency response. Based on the results of one or more tests, the design of the passive waveguide component may be modified such that the resulting passive waveguide component meets performance and/or functional expectations, while remaining manufacturable by the manufacturing flow 100.

Figure 2:
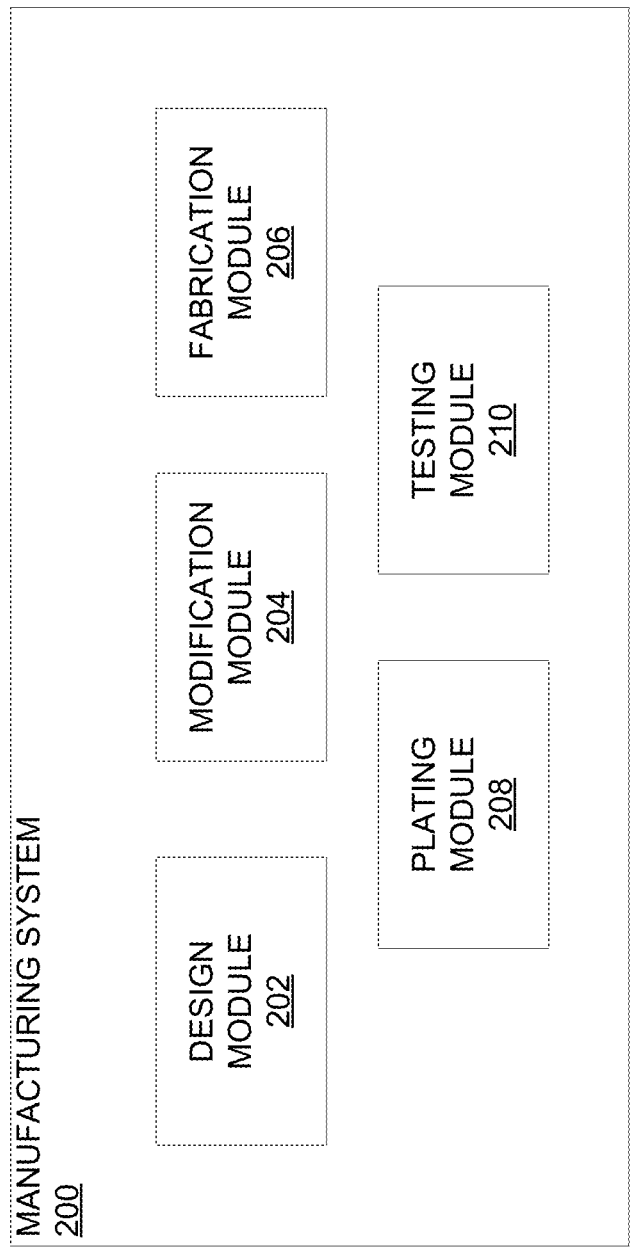
FIG. 2 is a diagram illustrating an example system for manufacturing a passive waveguide component according to some embodiments.

FIG. 2 is a diagram illustrating an example system 200 for manufacturing a passive waveguide component according to some embodiments. In some embodiments, the manufacturing system 200 may comprise a design module 202, a modification module 204, a fabrication module 206, a plating module 208, a cleaning module 210, and a testing module 212.

As used herein, the term "module" may describe a given unit of functionality that can be performed in accordance with various embodiments. As used herein, a module might be implemented utilizing any form of hardware, software, or a combination thereof. For example, manufacturing machinery, manufacturing tools, controllers, logical components, or software routines may be implemented to make up a module. In implementation, the various modules described herein may be implemented as discrete modules or the functions and features described of each can be shared in part or in total among one or more modules. Additionally, the use of the term "module" does not imply that the components or functionality described or claimed as part of the module are all configured in a common package or reside at the same location. Indeed, any or all of the various components of a module, whether manufacturing machinery, manufacturing tool, control logic or other components, can be combined in a single package or separately maintained and can further be distributed in multiple groupings or packages or across multiple locations.

Figure 12:
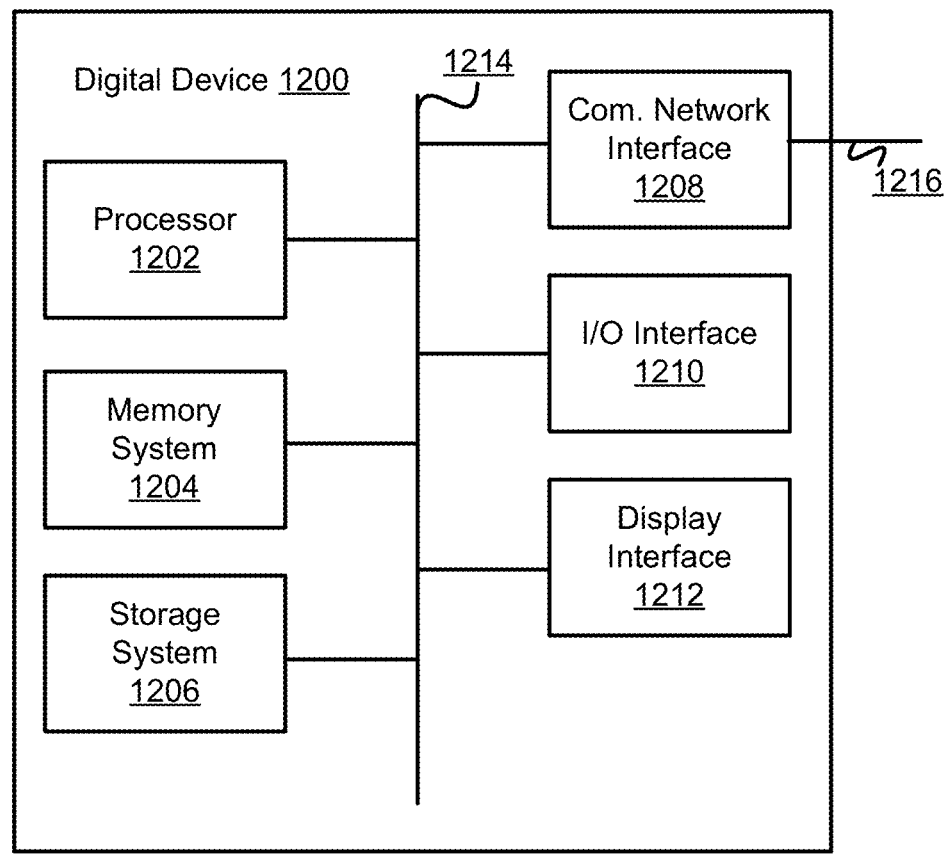
FIG. 12 is a block diagram of an example digital device with which aspects of systems and methods described herein can be implemented according to some embodiments.

It should be noted that where components or modules of some embodiments are implemented in whole or in part using software, these software elements may be implemented to operate with a digital device, such as the digital device which is discussed further with regard to FIG. 12.

The design module 202 may be configured to receive or create a design for a passive waveguide component. In some embodiments, a digital device may comprise all or part of the design module 202 and/or the modification module 204.

In one example, a digital device may be configured to receive or create a design and then store the design in a storage device. As also noted herein, depending on the embodiment, the design may be embodied in a design file, such as a computer-aided design (CAD) file, having a format that is compatible with a low cost fabrication technology utilized in some embodiments.

In various embodiments, the design module 202 may be configured to identify one or more structural features of the passive waveguide component that may impact the manufacturing process, electrical performance, and/or functionality. For example, the design module 202 may be configured to identify those structural features of the passive waveguide component that are difficult or impossible to fabricate with the fabrication module 206. In some embodiments, the design module 202 is configured to identify limits and constraints of the fabrication process based on the type of fabrication process, the machine(s) used during fabrication, the material to be used during fabrication, and/or the design of the waveguide components. Example structural features that may cause fabrication issues include, for example, sharp corners, features having a low diameter to high depth ratio (e.g., deep wells), and narrow features.

Similarly, the design module 202 may be configured to identify those structural features and material choices of the passive waveguide component that are difficult or impossible to plate with the plating module 208. In some embodiments, the design module 202 is configured to identify limits and constraints of the plating process based on the type of plating process used, the machinery conducting the plating process, the conductive plating material to be used during plating, and/or the design of the waveguide components. Example structural features that may cause plating issues include, for example, sharp corners, those features that may be difficult to fabricate including features having a low diameter to high depth ratio (e.g., deep wells), and narrow features.

Those of ordinary skill in the art would appreciate that identification of such structural features (by the design module 202) may depend on, and vary with, the fabrication technology being utilized by the fabrication module 206 and/or the plating technology utilized by the plating module 208.

The design module 202 and/or the modification module 204 may, automatically or with the help of a user, suggest alterations or modifications to the designs to allow for or improve the fabrication and/or plating of the passive waveguide component given the constraints of the fabrication process and/or the plating process. The modification module 204 may be configured to automatically modify and/or allow a user to modify, change, or adjust the design received or created by the design module 202.

In various embodiments, the design module 202 and/or the modification module 204 perform simulations to model and simulate the design and/or desired modifications. In one example, the design module 202 and/or the modification module 204 models, simulates, and/or measures performance and/or functional properties as electrical sensitivity, frequency response, impedance, return loss, and insertion loss of one or more designs.

Depending on the embodiment, the modification module 204 may be coupled with, or be part of, the design module 202. As noted herein, the design may be modified by the modification module 204 for any number of different reasons including, for example, to enable or improve the fabrication of a non-conductive structure by the fabrication module 206 and/or the plating of conductive material by the plating module 208. In another example, the design may be modified such that once a non-conductive structure is fabricated, the resulting non-conductive structure is prepared to receive a conductive layer.

Depending on the embodiment, modification(s) implemented by the modification module 204 may comprise splitting the passive waveguide component along one or more planes such that the passive waveguide component is divided into a plurality of separate structural features which may be separately fabricated and/or plated. Additionally, in some embodiments, the modification implemented may comprise a change in one or more dimensions of the passive waveguide component, or a change in shape of a structural feature of the passive waveguide component.

In some embodiments, the modification module 204 may modify the design based on the one or more structural features identified by the design module 202. Additionally, in some embodiments, the modification module 204 may modify the design based on electrical performance and/or functionality of the resulting passive waveguide component (e.g., as tested by the test module 210).

The fabrication module 206 may be configured to fabricate a non-conductive structure from the design of the passive waveguide component. In general, the fabrication module 206 may utilize a low cost fabrication technology selected for the manufacturing system 200. The design of the waveguide component fabricated by the fabrication module 206 may be received from the design module 202, or may be received from the modification module 204 (i.e., after modification). Depending on the embodiment and the fabrication technology selected, the non-conductive structure may comprise one of several materials including, without limitation, plastic, ceramic, or wood.

In some embodiments, the fabrication module 206 may comprise a three-dimensional (3D) printer configured to create a plastic model using powder and binder, or using acrylonitrile butadiene styrene (ABS) plastic deposition. For example, the fabrication module 206 may comprise a ZPrinter® from Z Corporation (which is a powder based printer), or a Dimension 3D Printer from Stratasys, Inc. (which is a fused deposition printer using ABS plastic). In some examples, the fabrication module 206 may comprise a component (e.g., a CNC machine or a three-dimensional printer) configured to create a mold of the non-conductive structure to be fabricated, and a second component (e.g., injection molding machine) that creates instances of the non-conductive structure using the mold. It should be noted that where the design of the passive waveguide component has been split into a plurality of separate structural features (e.g., by the modification module 204), the fabrication module 206 may fabricate each of the plurality of structural features as a plurality of separate non-conductive structural features. The non-conductive structure may comprise the plurality of separate non-conductive structural features. Subsequently, the plating module 208 may form a conductive layer over an exposed surface of at least one of the plurality of separate non-conductive structural features. Depending on the embodiment, the conductive layer may be formed before or after the plurality of separate non-conductive structural features are assembled together.

In some embodiments, where the fabrication module 206 comprises a powder-based three-dimensional (3D) printer, the fabrication module 206 may fabricate the non-conductive structure by the following steps. First, a thin layer of powder is spread to create a layer of the non-conductive structure. Second, an ink jet print head prints a binder on the portions of the layer that constitute a cross-section of the non-conductive structure. Third, a build piston on which the non-conductive structure is constructed drops to make room for the next layer. Subsequently, the first two steps are repeated for the next layer of the non-conductive structure. When the layering is complete, loose powder surrounding the printed non-conductive structure is shaken loose from the structure. Eventually, the non-conductive structure is impregnated for strength and easy machining/tapping (e.g., using xlaFORM). Depending on the embodiment, the powder utilized by a fabrication module 206 may have a coefficient of thermal expansion (CTE) similar to that of aluminum.

In some embodiments, where the fabrication module 206 comprises an ABS-based three-dimensional (3D) printer, the fabrication module 206 may fabricate the non-conductive structure by selectively depositing ABS plastic material and support material to create the non-conductive structure. Once the deposition is complete, the support structures may be either broken away or dissolved. Depending on the embodiment, the ABS plastic utilized by a fabrication module 206 may have a coefficient of thermal expansion (CTE) similar to that of aluminum.

In some embodiments, the fabrication module 206 may comprise an injection molding machine utilizing a metal mold and a liquid crystal polymer. Depending on the embodiment, the liquid crystal polymer utilized may have a coefficient of thermal expansion similar to that of aluminum.

The plating module 208 may be configured to form a conductive layer over at least one exposed surface of the non-conductive structure constructed by the fabrication module 206, thereby rendering exposed surfaces conductive. Depending on the embodiment, the plating module 208 may utilize a electroplating or electroless plating process to form the conductive layer. For some embodiments, the conductive layer may comprise a silver plating or a copper plating.

In some embodiments, the plating module 208 may form a conductive layer having a thickness that enables or creates an electrical feature of the passive waveguide component on the non-conductive structure. For example, the conductive layer may have a thickness that enables the conductive layer to benefit from skin effect and permit the bulk of a current operating at radio or microwave frequencies to flow through the conductive layer. In some embodiments, the thickness of the conductive layer may be greater than or equal to a skin depth for the conductive layer. The skin depth may be determined based on the conductive material of the conductive layer and the frequency of the current to be carried by the conductive layer (e.g., radio or microwave frequency).

As noted herein, where the passive waveguide component is fabricated as a plurality of separate non-conductive structural features, the plating module 208 may form a conductive layer over an exposed surface of at least one of the plurality of separate non-conductive structural features. The plating module 208 may form the conductive layer before or after the plurality of separate non-conductive structural features are assembled together.

The cleaning module 210 may be configured to clean, trim, polish, or prepare the non-conductive structures, non-conductive structural features, conductive layers, and or completed waveguide structures. In some embodiments, the cleaning module 210 cleans and trims excess non-conductive material from the non-conductive structures and/or non-conductive structural features fabricated by the fabrication module 206. In one example, excess material may be left behind as a part of the fabrication process. The excess material may inhibit effective plating, final assembly, and/or waveguide performance. The cleaning module 210 may remove the excess material by trimming the material from the non-conductive structure or the non-conductive structural features. For example, the cleaning module 210 may clear holes of debris, clear material from cavities, and remove general residue.

The cleaning module 210 may also polish and/or clean conductive material left by the plating module 208. The excess conductive material may inhibit assembly and/or waveguide performance. The cleaning module 210 may trim or otherwise remove unneeded conductive material from holes, cavities, wells, and the like.

In some embodiments, the cleaning module 210 may prepare the non-conductive structures and/or the non-conductive structural features for plating. For example, the cleaning module 210 may apply an abrasive or a material to increase effectiveness of plating the non-conductive structure.

Those skilled in the art will appreciate that the cleaning module 210 may allow for the use of different fabrication and plating techniques that may otherwise not be sufficiently precise to produce a waveguide component with desired performance.

The testing module 212 may be configured to test and evaluate the electrical performance and/or function of the passive waveguide component once the components manufacturing has been completed (e.g., once the non-conductive structure has been fabricated, plated, and assembled if necessary). In some embodiments, the passive waveguide component may be tested for such performance and/or functional properties as electrical sensitivity, frequency response, impedance, return loss, and insertion loss. Based on the results of the test and evaluation of testing module 212, the design of the passive waveguide component may be modified through the modification module 204.

The testing module 212 may be configured to test designs and assist in the design of prototypes to help develop designs of waveguide components that may be effectively fabricated and plated. In some embodiments, the testing module 212 may test waveguide components at predetermined intervals or test a subset of the total number of waveguide components that are fabricated and/or plated. In some embodiments, the testing module 212 is configured to test non-conductive structures from the fabrication module 206, conductive and/or conductive layers.

Those skilled in the art will appreciate that although the fabrication process is described as fabricating a non-conductive structure, the fabrication process may also be configured to fabricate a semi-conductive structure or a conductive structure that may be used within at least some embodiments described herein.

Figure 3:
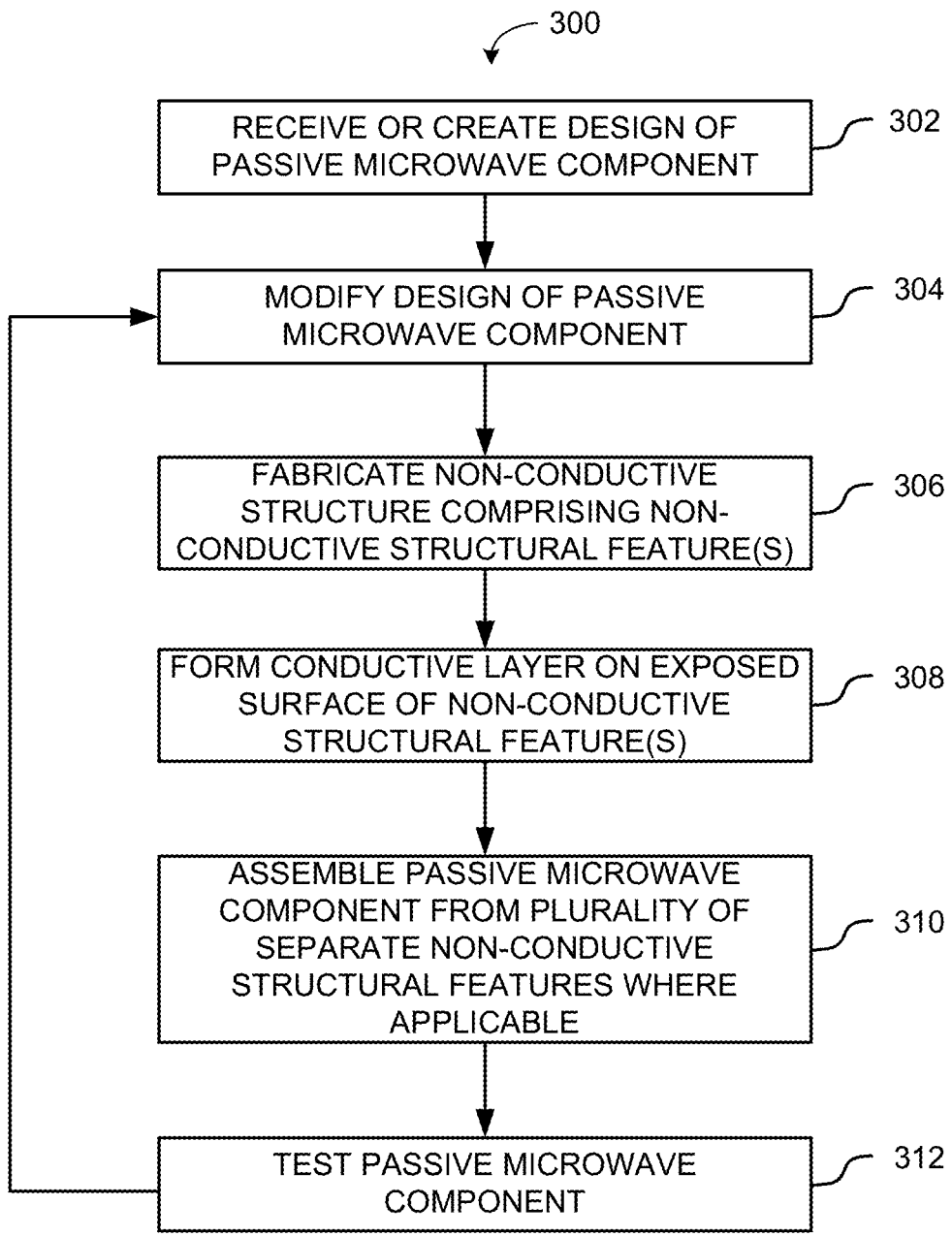
FIG. 3 is a flowchart illustrating an example method for manufacturing a passive waveguide component according to some embodiments.

FIG. 3 is a flowchart illustrating an example method 300 for manufacturing a passive waveguide component according to some embodiments. At step 302, the design module 202 may receive or create a design of the passive waveguide component intended to be manufactured. As described herein, the design is received or created as a design file that is compatible with the fabrication technology selected for the manufacturing process. At step 304, the modification module 204 may modify the design of the passive waveguide component. For example, the modification module 204 may modify the design based on the structural features identified by the design module 202 as structural features that will cause fabrication and/or plating issues in later stages of the manufacturing process. Which structural features are identified by the design module 202 may depend on, and vary with, the fabrication technology selected and/or the plating technology utilized in the method 300. As also noted herein, the modification module 204 may modify the design based on tests performed on the resulting passive waveguide component. In some embodiments, the testing module 212 may perform the tests.

At step 306, the fabrication module 206 may fabricate the non-conductive structure from the design, where the non-conductive structure may comprise one or more non-conductive structural features. As noted herein, where the design of the passive waveguide component has been split into a plurality of separate structural features, the fabrication module 206 may fabricate the plurality of separate structural features as a plurality of separate non-conductive structural features.

Optionally, the cleaning module 210 may clean, trim, and/or otherwise process the non-conductive structure and/or non-conductive structural features to remove undesired non-conductive material that may be left behind during fabrication. The cleaning module 210 may remove excess material and/or debris to prepare the non-conductive structure and/or non-conductive structural features for plating and/or assembly.

At step 308, the plating module 208 may form a conductive layer on at least a portion of a surface of a non-conductive structural feature of the non-conductive structure. As described herein, where the passive waveguide component is fabricated as a plurality of separate non-conductive structural features (i.e., at step 306 by the fabrication module 206), the plating module 208 may form a conductive layer over an exposed surface of at least one of the plurality of separate non-conductive structural features. Depending on the embodiment, the conductive layer may be formed over the exposed surface before or after the plurality of separate non-conductive structural features are assembled together.

Optionally, the cleaning module 210 may clean, trim, and/or otherwise polish the conductive layer to remove undesired conductive material that may be left behind during plating. The cleaning module 210 may remove excess material and/or debris to prepare the waveguide component for assembly and use.

In some embodiments, where step 306 results in a plurality of separate non-conductive structural features, the plurality of separate non-conductive structural features may be in disassembled form for step 308, or may be partially assembled for step 308. Then, at step 310, the plurality of separate structural features that result from step 308 are assembled into the passive waveguide component.

At step 312, the passive waveguide component that results from step 308 (or step 310, where applicable) may be tested by testing module 212. As described herein, the passive waveguide component may be tested for such performance and/or functional properties as electrical sensitivity, frequency response, impedance, return loss, and insertion loss. Based on the results of the test and evaluation, the design of the passive waveguide component may be modified by modification module 204 at step 304. Once the passive waveguide component has been modified at step 304, the steps 306-312 of method 300 may be repeated.

Although fabricating and plating a passive waveguide component is discussed herein, those skilled in the art will appreciate that systems and methods described may apply to active (i.e., non-passive) waveguide components. Further, the systems and methods described herein may apply to any component for use within a microwave communication system (e.g., a peer-to-peer communication system or backhaul for a microwave communication system).

Figure 4:
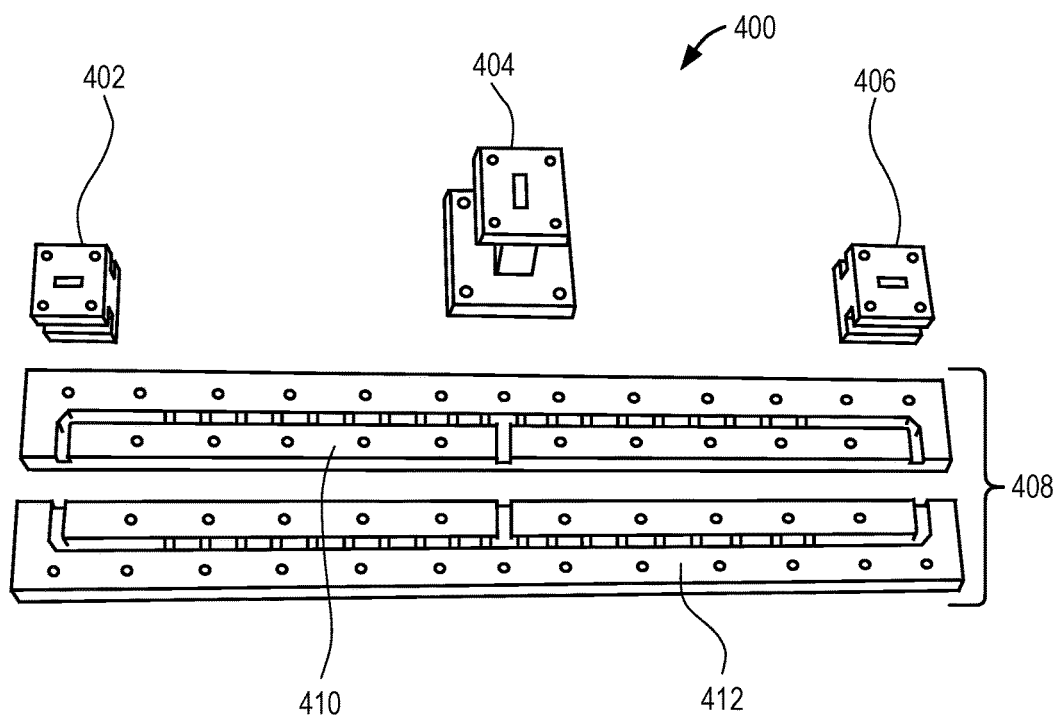
FIG. 4 depicts example non-conductive structures fabricated by the fabrication module according to some embodiments.

FIG. 4 depicts example non-conductive structures 400 fabricated by the fabrication module 206 according to some embodiments. In particular, FIG. 4 depicts the non-conductive structure of a waveguide spacer 402, the non-conductive structure of a waveguide spacer 404, the non-conductive structure of a waveguide spacer 406, and the non-conductive structures of a passive waveguide diplexer 408. In accordance with some embodiments, the passive waveguide diplexer 408 is split in half along a plane in accordance with some embodiments. The passive waveguide diplexer 408 as split comprises two halves 410 and 412.

Figure 5:
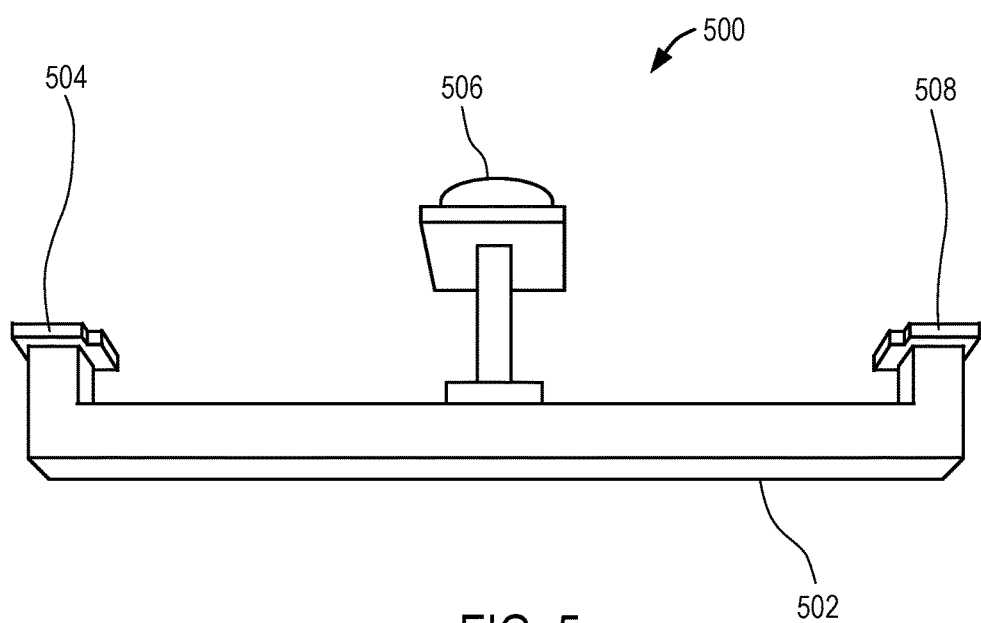
FIG. 5 depicts an example of an assembled non-conductive structure of a passive waveguide diplexer assembly assembled according to some embodiments.

FIG. 5 depicts an example of an assembled non-conductive structure of a passive waveguide diplexer assembly 500 according to some embodiments. In FIG. 5, the passive waveguide diplexer assembly 500 comprises a passive waveguide diplexer 502, a waveguide spacer 504, a waveguide spacer 506, and a waveguide spacer 508. The waveguide spacers 504 and 508 are coupled to the receive/transmit ports of the passive waveguide diplexer 502, while the waveguide spacer 506 is coupled to the common port of the passive waveguide diplexer 502. In some embodiments, the passive waveguide diplexer 502 may be formed by combining the two halves 410 and 412 of FIG. 4, and the waveguide spacers 504, 506, and 508 may be respectively similar to the waveguide spacers 402, 406, and 408 of FIG. 4. Additionally, in some embodiments, the passive waveguide diplexer assembly 500 may be assembled either before or after a plating process.

Figure 6:
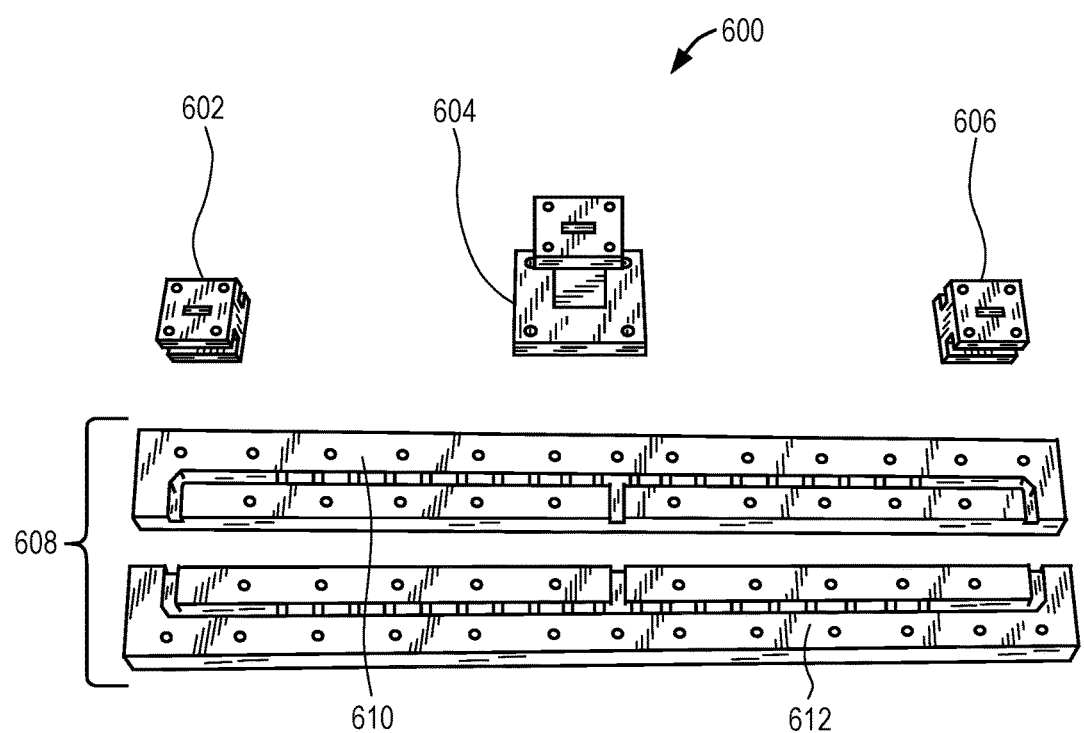
FIG. 6 depicts an example structure having at least some conductive plating according to some embodiments.

FIG. 6 depicts example structures 600 having at least some conductive plating according to some embodiments. In particular, FIG. 6 depicts the structure of a waveguide spacer 602, the structure of a waveguide spacer 604, the structure of a waveguide spacer 606, and the structures of a passive waveguide diplexer 608. In some embodiments, there is conductive layer plated on at least a portion of the waveguide spacers 602, 604, and 606 and/or the passive waveguide diplexer 608. The conductive layer may comprise copper or silver.

In accordance with some embodiments, the passive waveguide diplexer 608 may be split in half along a plane. The passive waveguide diplexer 608 as split comprises two halves 610 and 612. In FIG. 6, the two halves 610 and 612 remained split when the conductive layer was formed. For some embodiments, the passive waveguide diplexer formed by the two halves 610 and 612 may have an operational bandwidth of up to 60 GHz. In various embodiments, the conductive structures 600 may be similar in form to the non-conductive structures 400 of FIG. 4, and may be formed by plating the non-conductive structures 400.

In some embodiments, the non-conductive structures 400 (see FIG. 4), passive waveguide diplexer assembly 500 (see FIG. 5), and the structures 600 (see FIG. 6), may be designed, fabricated, plated, cleaned, and/or tested by all or part of the manufacturing system 200.

Figure 7:
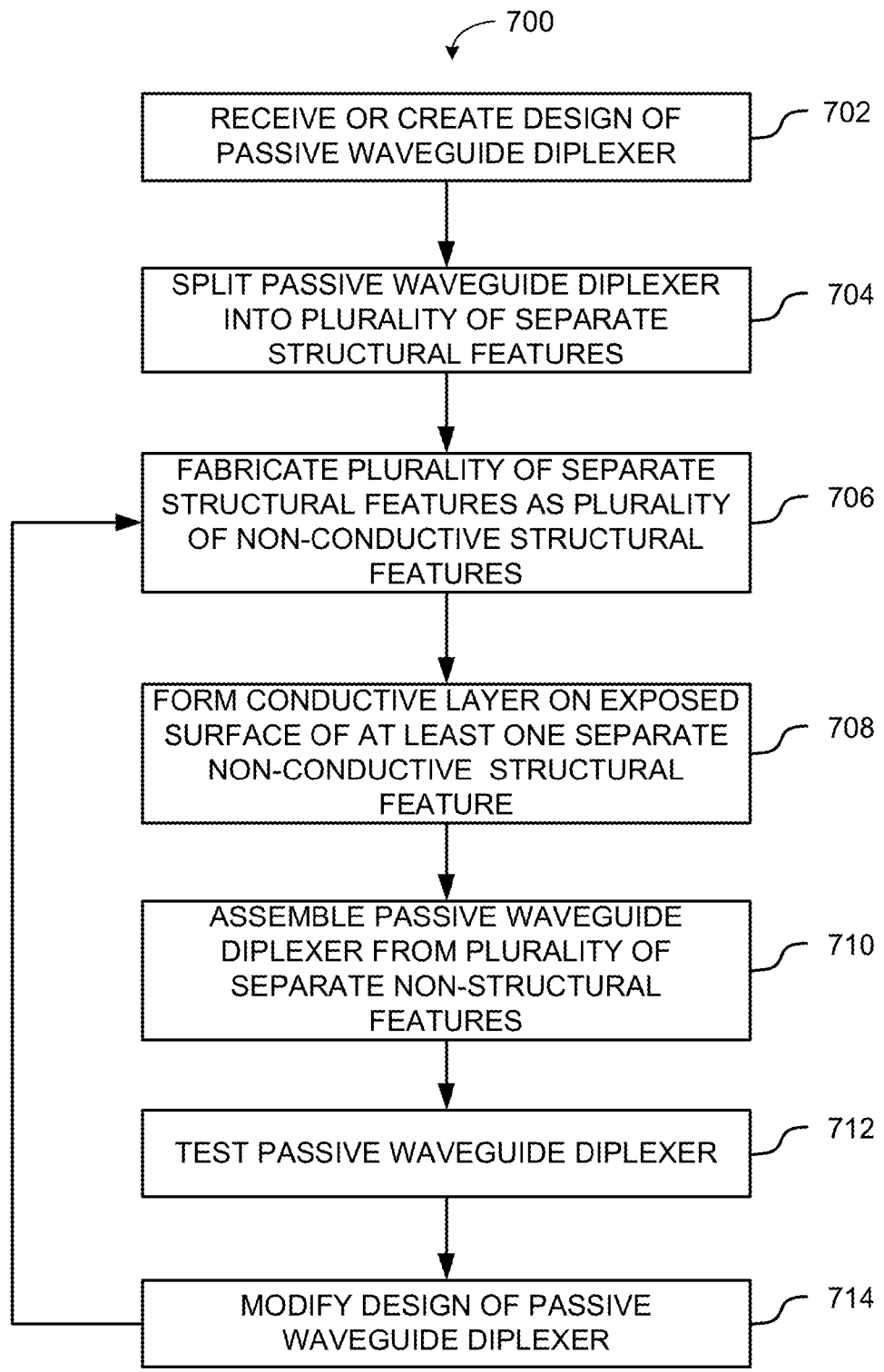
FIG. 7 is flowchart illustrating an example method for manufacturing a passive waveguide diplexer according to some embodiments.

FIG. 7 is flowchart illustrating an example method 700 for manufacturing a passive waveguide diplexer according to some embodiments. At step 702, the design module 202 may receive or create a design of the passive waveguide diplexer to be manufactured. As described herein, the design may be received or created as a design file that is compatible with the fabrication technology selected for the manufacturing process.

Thereafter, at step 704, the modification module 204 may modify the design such that the passive waveguide diplexer is split into a plurality of separate structural features. For example, the passive waveguide diplexer may be split along a plane such that the plurality of separate structural features comprises two structural halves.

At step 706, the fabrication module 206 may fabricate separate non-conductive structural features based on designs or instructions from the design module 202 and/or the modification module 204. For example, where the plurality of separate structural features comprises two structural halves of the passive waveguide diplexer, the fabrication module 206 may fabricate two non-conductive structural halves 410 and 412 of the passive waveguide diplexer 408.

Optionally, the method may further comprise a cleaning step where the cleaning module 210 may clean, trim, and/or otherwise process the non-conductive structure and/or non-conductive structural features to remove undesired non-conductive material that may be left behind during fabrication.

At step 708, the plating module 208 may form a conductive layer on at least a portion of a surface of at least one of the plurality of separate non-conductive structural features that results from step 706. For example, where the plurality of separate non-conductive structural features comprises two structural halves of the passive waveguide diplexer, the fabrication module 206 may result in the two conductive structural halves 610 and 612 of the passive waveguide diplexer 608.

Optionally, the method may further comprise a cleaning step where the cleaning module 210 may clean, trim, polish and/or otherwise process the conductive layer(s) to remove undesired conductive material that may be left behind during plating.

At step 710, the passive waveguide diplexer may be assembled from the plurality of separate structural features 610 and 612 that result from step 708. For some embodiments, the passive waveguide diplexer once assembled may be similar in form to the passive waveguide diplexer 502 of FIG. 5.

At step 712, the passive waveguide diplexer that results from step 710 may be tested by testing module 212. As described herein, the passive waveguide diplexer may be tested for such performance and/or functional properties as electrical sensitivity, frequency response, impedance, return loss, and insertion loss. Based on the results of the test and evaluation, the design of the passive waveguide component may be modified at step 714, by modification module 204. Subsequently, once the passive waveguide diplexer has been modified at step 714, steps 706-714 of method 700 may be repeated in the order of FIG. 7.

Figure 8:
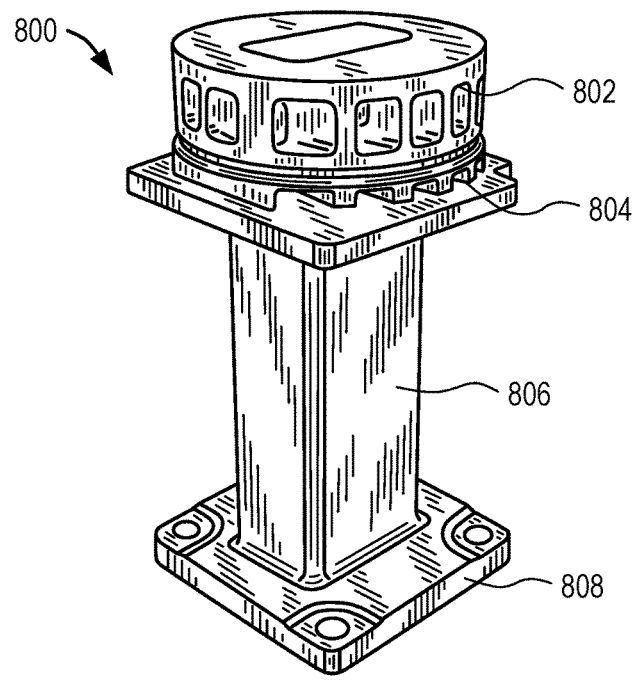
FIG. 8 is a side view of a waveguide spacer including a spacer component according to some embodiments.

FIG. 8 is a side view of a waveguide spacer 800 including a spacer component 802 according to some embodiments. The waveguide spacer 800 may be designed, fabricated, plated, cleaned, and/or tested by all or part of the manufacturing system 200. The waveguide spacer 800 comprises a spacer component 802, a first flange component 804, an extended body 806, and a second flange component 805.

Figure 9:
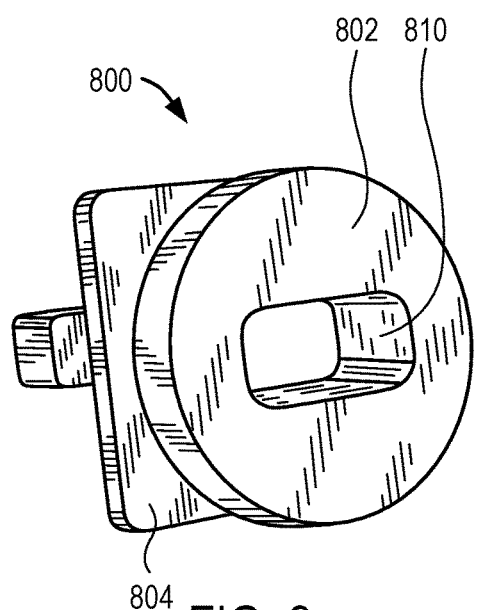
FIG. 9 is a top view of the spacer component on top of the waveguide spacer according to some embodiments.

FIG. 9 is a top view of the spacer component 802 on top of the waveguide spacer 800 according to some embodiments. The spacer component 802 is circular in shape, protrudes from the first flange component 804, and comprises a first opening 810.

Figure 10:
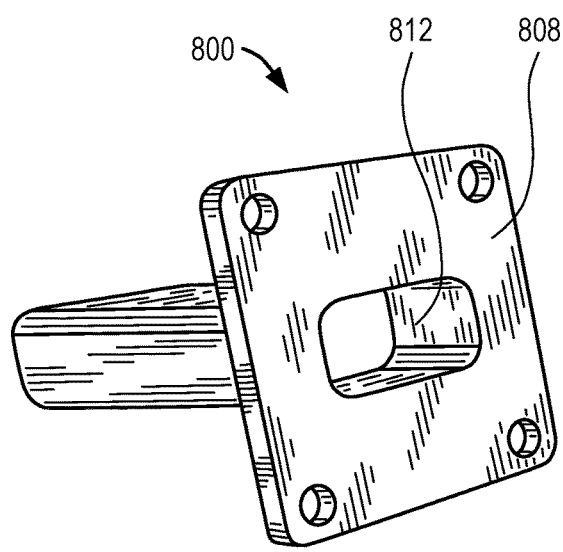
FIG. 10 is a bottom view of the waveguide spacer according to some embodiments.

FIG. 10 is a bottom view of the waveguide spacer 800 according to some embodiments. The second flange component 805 comprises a second opening 812. The waveguide spacer 800 of FIGS. 8-10 is plated with a conductive layer. The conductive layer may comprise a silver plating or a copper plating.

In some embodiments, the first opening 810 may connect with the second opening 812 through the extended body 806. Further, in some embodiments, the spacer component 802 and/or the first flange 804 may be configured to assist in coupling the waveguide spacer 800 with another waveguide component, a piece of radio equipment, or an antenna having a compatible receiving point. Similarly, in some embodiments, the second flange may be configured to assist in coupling the waveguide spacer 800 with another waveguide component, a piece of radio equipment, or an antenna having a compatible receiving point.

Figure 11:
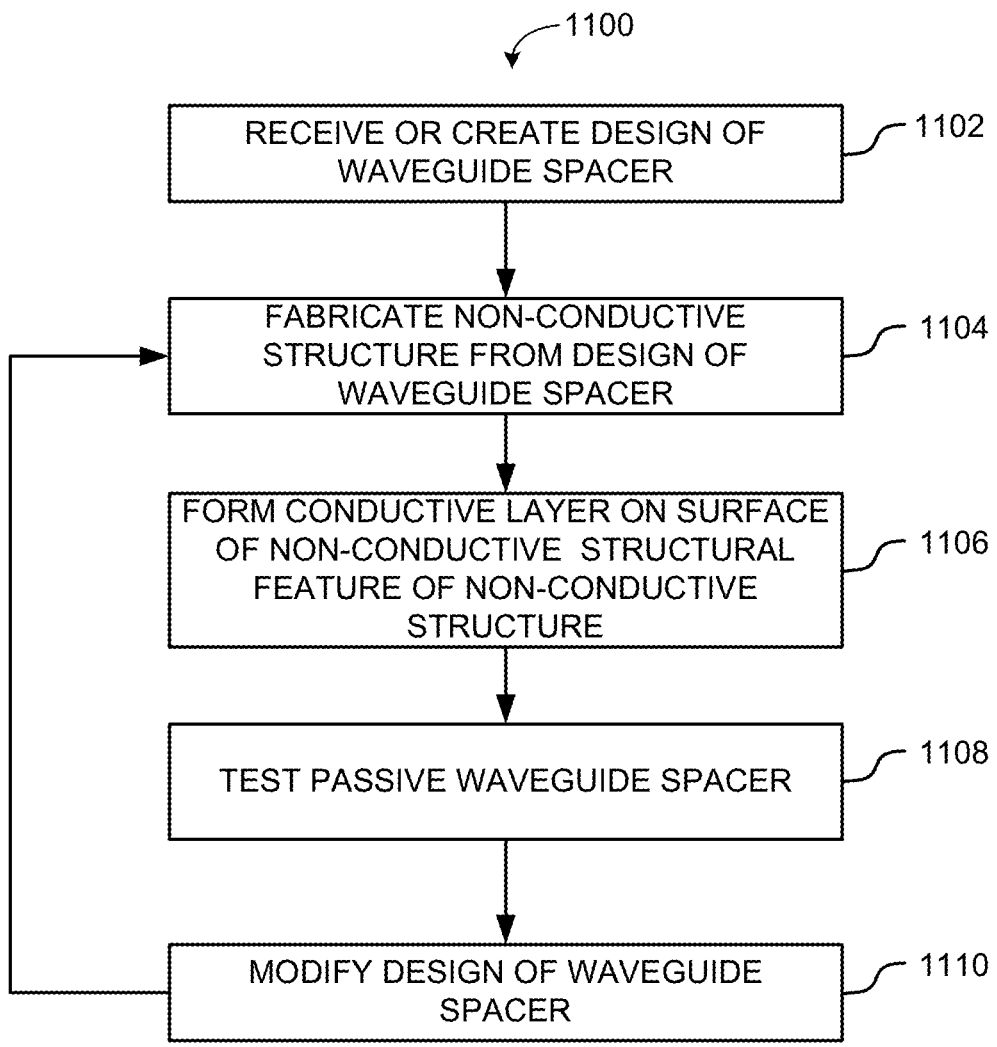
FIG. 11 is a flowchart illustrating an example method for manufacturing a waveguide spacer according to some embodiments.

FIG. 11 is flowchart illustrating an example method 1100 for manufacturing a waveguide spacer according to some embodiments. At step 1102, the design module 202 may receive or create a design of the waveguide spacer to be manufactured. As described herein, the design may be embodied in a design file that is compatible with the fabrication technology selected for the manufacturing process.

Then, at step 1104, the fabrication module 206 may fabricate a non-conductive structure of the waveguide spacer from the design. Optionally, as discussed herein, the method may further comprise a cleaning step where the cleaning module 210 may clean, trim, and/or otherwise process the non-conductive structure to remove undesired non-conductive material that may be left behind during fabrication Subsequently, at step 1106, the plating module 208 may form a conductive layer on an exposed surface of at least one non-conductive structural of the non-conductive structure. Optionally, the method may further comprise a cleaning step where the cleaning module 210 may clean, trim, polish and/or otherwise process the conductive layer(s) to remove undesired conductive material that may be left behind during plating. Once the plating module 208 and/or cleaning module 210 complete the function, a functional waveguide spacer 800 (see FIG. 800) may be created.

At step 1108, the waveguide spacer resulting from step 1106 may be tested by testing module 212. As described herein, the waveguide spacer may be tested for such performance and/or functional properties as electrical sensitivity, frequency response, impedance, return loss, and insertion loss. Based on the results of the test and evaluation, the design of the waveguide spacer may be modified at step 1110, by modification module 204. Subsequently, once the passive waveguide component has been modified at step 1110, steps 1104-1108 of method 1100 may be repeated in the order of FIG. 11.

FIG. 12 is a block diagram of an exemplary digital device 1200. The digital device 1200 comprises a processor 1202, a memory system 1204, a storage system 1206, a communication network interface 1208, an I/O interface 1210, and a display interface 1212 communicatively coupled to a bus 1214. The processor 1202 is configured to execute executable instructions (e.g., programs). In some embodiments, the processor 1202 comprises circuitry or any processor capable of processing the executable instructions.

The memory system 1204 is any memory configured to store data. Some examples of the memory system 1204 are storage devices, such as RAM or ROM. The memory system 1204 can comprise the ram cache. In various embodiments, data is stored within the memory system 1204. The data within the memory system 1204 may be cleared or ultimately transferred to the storage system 1206.

The storage system 1206 is any storage configured to retrieve and store data. Some examples of the storage system 1206 are flash drives, hard drives, optical drives, and/or magnetic tape. In some embodiments, the digital device 1200 includes a memory system 1204 in the form of RAM and a storage system 1206 in the form of flash data. Both the memory system 1204 and the storage system 1206 comprise computer readable media, which may store instructions or programs that are executable by a computer processor including the processor 1202.

The communication network interface (com. network interface) 1208 can be coupled to a network via the link 1216. The communication network interface 1208 may support communication over an Ethernet connection, a serial connection, a parallel connection, or an ATA connection, for example. The communication network interface 1208 may also support wireless communication (e.g., 802.12a/b/g/n, WiMax). It would be apparent to those skilled in the art that the communication network interface 1208 can support many wired and wireless standards.

The optional input/output (I/O) interface 1210 is any device that receives input from the user and output data. The optional display interface 1212 is any device that is configured to output graphics and data to a display. In one example, the display interface 1212 is a graphics adapter.

It would be appreciated by those skilled in the art that the hardware elements of the digital device 1200 are not limited to those depicted in FIG. 12. A digital device 1200 may comprise more or less hardware elements than those depicted. Further, hardware elements may share functionality and still be within various embodiments described herein. In one example, encoding and/or decoding may be performed by the processor 1202 and/or a co-processor located on a GPU (e.g., an Nvidia® co-processor).

The above-described functions and components can be comprised of instructions that are stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accordance with some embodiments. Those skilled in the art are familiar with instructions, processor(s), and storage medium.

What is claimed is:

1. A passive waveguide component manufactured by a method comprising the steps of:
   receiving an initial structural design for a passive waveguide component;
   identifying, in the initial structural design, at least one plane through the passive waveguide component along which the passive waveguide component is to be split into a plurality of separate structural features;
   modifying the initial structural design to split the passive waveguide component along the at least one plane, thereby resulting in a modified structural design for the plurality of separate structural features;
   receiving a non-conductive material;
   fabricating, using the modified structural design and the non-conductive material, the plurality of separate structural features of the passive waveguide component, thereby fabricating a plurality of separate non-conductive structural features
   providing a conductive layer on at least one exposed surface of at least one of the plurality of separate non-conductive structural features to create at least one electrical feature of the passive waveguide component, the conductive layer being thick enough to generate a skin effect at radio or microwave frequencies; and
   assembling the plurality of separate structural features including the at least one electrical feature to fabricate the passive waveguide component.

2. The passive waveguide component of claim 1, wherein fabricating the plurality of separate structural features comprises fabricating each of the plurality of separate structural features using three-dimensional printing or plastic injection molding.

3. The passive waveguide component of claim 1, wherein the non-conductive material comprises plastic, ceramic, or wood.

4. The passive waveguide component of claim 1, wherein providing the conductive layer on the at least one exposed surface of the at least one of the plurality of separate non-conductive structural features comprises plating the at least one exposed surface with a conductive material.

5. The passive waveguide component of claim 1, wherein the method further comprises the step of trimming or polishing at least one of the plurality of separate non-conductive structural features, or trimming or polishing the conductive layer.

6. The passive waveguide component of claim 1, wherein the conductive layer comprises copper or silver.

7. The passive waveguide component of claim 1, wherein the passive waveguide component is a passive waveguide diplexer.

8. The passive waveguide component of claim 1, wherein the method further comprises the step of cleaning the passive waveguide component to remove debris left behind by fabrication.

9. The passive waveguide component of claim 1, wherein the at least one plane is an E-plane of the passive waveguide component or an H-plane of the passive waveguide component.

10. The passive waveguide component of claim 1, wherein the step of assembling occurs before the step of providing the conductive layer on the at least one exposed surface.

* * * * *